United States Patent [19]

Harris

[11] 4,409,537

[45] Oct. 11, 1983

[54] INTERCONNECTION OF PRIMARY CELLS

[75] Inventor: William A. Harris, New Brighton, Minn.

[73] Assignee: Honeywell Inc., Minneapolis, Minn.

[21] Appl. No.: 363,982

[22] Filed: Mar. 31, 1982

[51] Int. Cl.³ .......................................... H01M 10/44
[52] U.S. Cl. ........................................ 320/7; 136/244
[58] Field of Search ................... 307/48, 51; 136/244, 136/293; 320/7, 16

[56] References Cited

U.S. PATENT DOCUMENTS

| | | | |
|---|---|---|---|
| 3,268,366 | 8/1966 | Guyot | 136/89 |
| 3,433,676 | 3/1969 | Stein | 136/89 |
| 3,437,818 | 4/1969 | Shattuck | 250/212 |
| 3,636,539 | 1/1972 | Gaddy | 340/210 |
| 3,946,375 | 3/1976 | Bishop et al. | 307/51 X |
| 4,040,867 | 8/1977 | Forestieri et al. | 136/89 P |

Primary Examiner—William M. Shoop
Attorney, Agent, or Firm—Charles G. Mersereau

[57] ABSTRACT

A method and apparatus for interconnecting one or more groups of primary electric cells in which cells in each group are further divided into two series-connected subgroups which, in twin, are connected to a three-conductor transmission system having a positive, a negtive and a neutral or return conductor. One subgroup of each group is connected between the negative terminal and the neutral and the other subgroup is connected between the positive terminal and the neutral such that the line to line voltage is twice that of the line to neutral voltage similar to a three-wire traditional AC supply system.

17 Claims, 3 Drawing Figures

4,409,537

INTERCONNECTION OF PRIMARY CELLS

BACKGROUND OF THE INVENTION

1. Field of the Invention

The present invention relates generally to power supplies using interconnected primary cells and, more particularly, to a three-conductor power transmission interconnect system for series grouped cells which reduces the relative transmission voltage and prevents transmission interruption due to the loss of one or more cells in any group.

2. Description of the Prior Art

Power supplies using a plurality of groups or strings of series-connected primary cells are well known. Conventionally each group is made large enough so that the full required potential is achieved by connecting all the cells in the group in series. Power is achieved by connecting additional groups in parallel across a two-conductor transmission system.

Conventional power transmission techniques employed to reduce transmission losses in such systems normally utilize increased wire sizes and higher transmission voltages. The use of larger wire sizes increases the system costs and higher voltage outputs from the cell strings raise the cell-to-mounting structure insulation or standoff voltage requirements. This also adds to the a cost of the a system.

In some systems the output of the cells is accompanied by high levels of heat such that the cells must continually be cooled. This occurs in the case of some fuel cells and certainly with photovoltaic conversion cells. It is desirable that the amount of electrical insulation required be minimized because the insulation decreases the thermal conductivity between the cells and the cooling medium. Thus, this added insulation necessitated by the high potential to ground of conventional series-connected cell groups causes the cells to operate at a higher than desirable temperature. In some cases, this may create the danger of cell explosion and, in others such as photovoltaic cells, will reduce the cell power output.

Another problem associated with many interconnection systems involves the loss of one or more cells. Conventional systems do not have any isolation protection between groups of cells. Thus, if a short or other failure occurs in one group of cells, the entire power transmission system will be affected and may fail.

These problems have led to a need for a cell interconnecting power transmission system which reduces cell string to mounting surface intrinsic standoff voltage requirements, reduces interconnecting wire resistance power losses for a given interconnecting wire size and which prevents a fault in one group of cells from inhibiting the normal operation of any other such groups in the power supply.

SUMMARY OF THE INVENTION

According to the present invention, there is provided a method and apparatus for interconnecting one or more groups of primary electric cells in which cells in each group are further divided into two series-connected subgroups which, in turn, are connected to a three-conductor transmission system having a positive, a negative and a neutral or return conductor. One subgroup of each group is connected between the negative terminal and the neutral and the other is connected between the positive terminal and the neutral such that the line to line voltage is twice that of the line to neutral voltage similar to a three-wire traditional AC supply system. Multiple groups are normally connected to the conductors in parallel. Current reversal in each connection is prevented by connecting a diode, or the like, in series in the line connecting each subgroup to the positive or negative conductor. This system reduces the cell string to mounting surface intrinsic standoff voltage requirement, reduces interconnecting wire resistance power losses for a given interconnecting wire size and prevents a fault in one group of primary cells from inhibiting the normal operation of any other group of cells in the power transmission system. The system can be used with any type of primary cell including electrochemical and photovoltaic cells.

BRIEF DESCRIPTION OF THE DRAWINGS

In the drawings wherein like numerals are utilized to designate like parts throughout the same.

DESCRIPTION OF THE PREFERRED EMBODIMENT

Figure 1:
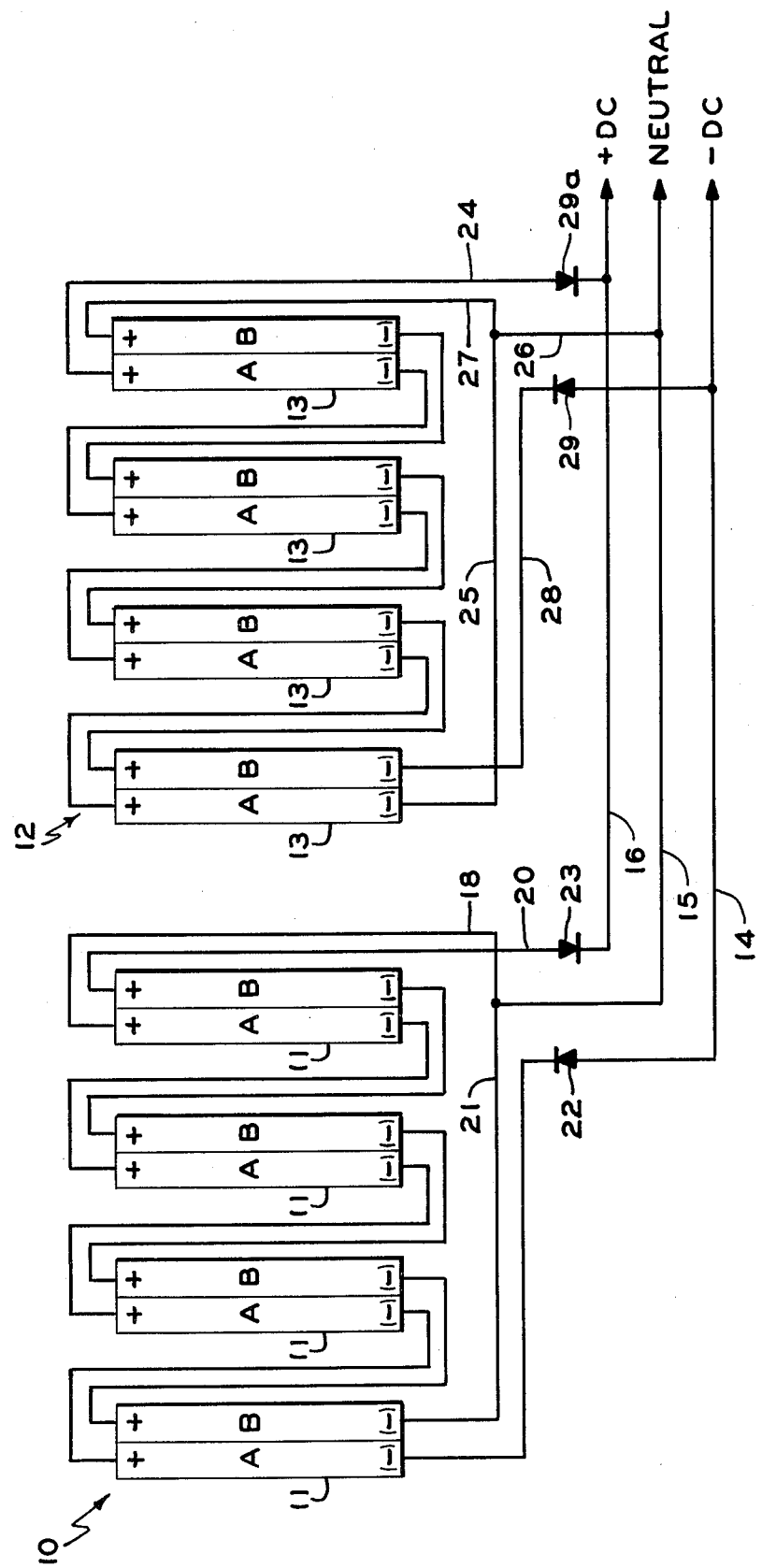
FIG. 1 is a schematic diagram showing the connection of two groups of cells in the manner of the invention.

FIG. 1 depicts the primary electric cell interconnect system of the invention. The primary cells are divided into a group 10 having eight cells 11 and a group 12 having eight cells 13. While the arrangement is not necessary for many applications, the cells are shown arranged in pairs in accordance with the connection of solar photovoltaic half-cells of one application of the invention. Each group is further divided into two subgroups of "A" and "B" cells. As illustrated in FIG. 1 the A cells and the B cells are separately connected in series and are connected to a three-conductor transmission system containing a negative conductor 14, return or neutral conductor 15 and positive conductor 16. The A cells of group 10 are connected via lines 17 and 18 between negative conductor 14 and a common return or neutral line 19 which, in turn, is connected to return or neutral line 15. The serially connected cells B are connected via lines 20 and 21 between the positive conductor 16 and common return, or neutral line 19. Diodes 22 and 23 are provided to prevent any reverse current flow in the conductors 17 and 20.

In similar fashion, the series of A cells of group 12 are connected via conductors 24, 25 and 26 between the positive conductor 16 and the neutral conductor 15 and the series of B cells of group 12 are connected via 26, 27 and 28 between the negative conductor 14 and neutral return or return conductor 15. Diodes 29 and 29a are provided for group 12.

In this manner, the series-connected A cells of group 10 are connected in parallel with the series connected B cells of group 12 and the series connected B cells of group 10 are connected in parallel with the series-connected A cells of group 12. It will be appreciated that the total available potential to a load will be twice the line to neutral potential of each serially connected subgroup. Thus, positive and negative interconnection allows transmission at twice the cell string to mounting surface intrinsic standoff voltage. This also reduces interconnecting wire resistance power losses for a given interconnecting wire size. The presence of the diodes prevents a fault in one group or subgroup of cells from inhibiting normal operation of any other connected group or subgroup.

Figure 2:
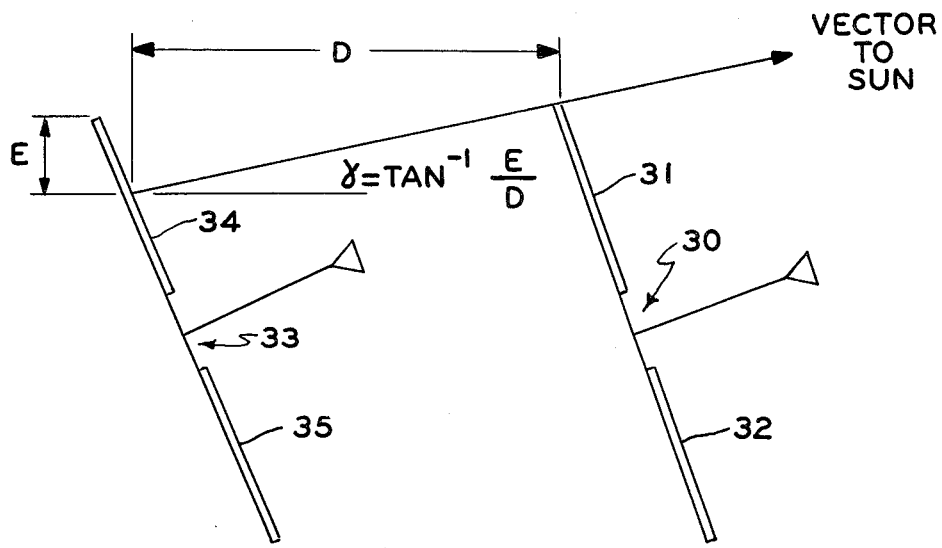
FIG. 2 is a schematic diagram of solar collectors which may have cells connected in the manner of FIG. 1.

FIG. 2 illustrates the adjacent collector shading problem commonly associated with plurality of rows of solar panels utilizing photovoltaic cells. The front row of collectors is represented by 30 and includes top collector halves 31 and bottom collector halves 32. The second and subsequent rows are represented by collector 33 including top halves 34 and bottom halves 35. The diagram of FIG. 2, illustrates how a field of tracking solar collectors will have greatly decreased power output at low sun angles because of the shading problem. In the illustration only approximately the top half of the top row of half panels 34 and in all rows behind the front row 30 receive solar energy at the illustrated low sun angle.

The conventional collector field wiring configurations utilizes adjacent half panels wired in series. As illustrated in the collector power output diagram FIG. 3, no power is available with this type of wiring until the sun angle reaches point b which is approximately 10 degrees and the half-power or 50 percent power angle is about 14 degrees.

Figure 3:
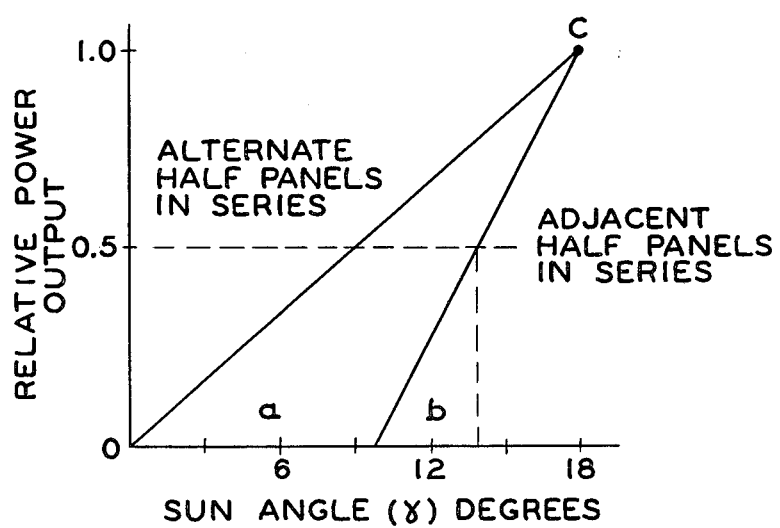
FIG. 3 is a diagram showing the increased power output utilizing the cell interconnect method of the invention in regard to solar photovoltaic conversion.

As noted in connection with FIG. 1, the A and B series strings as illustrated there are paired and connected so as to be alternately "left half negative" and "left half positive." This is not material for most applications, however, it is significant with respect to the connection of photovoltaic solar cells because it enables a small amount of power to be available at very shallow sun angles and allows the system to reach the half power sun angle at about 10 degrees as illustrated by the line ac in the diagram of FIG. 3. The increased power output for the alternately serially connected half panels is illustrated by the triangle abc.

An added advantage with respect to utilizing the three-wire power transmission system in accordance with the present invention because of the reduced line to neutral voltage in each conductor occurs with primary cells which have to be provided with thermal cooling during operation, such as photovoltaic solar cells. By halving the output voltage requirement of each series-connected string, the electrical insulation requirements are decreased and thermal conductivity is enhanced. This, of course, increases the overall power production efficiency.

The operation of the system is also greatly aided by the use of the diodes to prevent reversal of electric currents, inasmuch as it isolates the effect of a fault in any one cell or string of cells such that even though the cell or subgroup of cells having the fault will not deliver any power, it will not interfere with the power, output of the other serially connected strings of cells insofar as the load is concerned. In the case of solar photovoltaic cells, this allows a significant reduction in the basic electrical insulation level required because it is normal practice to insulate the system for approximately five times the normal voltage level because faults may short out the entire field of collectors if the conventional wiring practices are followed. This, of course, gives the wiring scheme of the present invention a decided advantage as thermal cooling is also facilitated.

The embodiments of the invention in which an exclusive property or right is claimed are defined as follows:

1. A method for supplying power from at least one group of primary electric cells, said method comprising the steps of:
   connecting said at least one group of primary electric cells to form two series-connected subgroups each containing one-half of the cells;
   connecting said at least one group of primary electric cells to a three-conductor electric supply system having positive, negative and neutral conductors such that one of said series-connected subgroups is connected between the negative conductor and the neutral conductor and the other of said serially connected subgroups is connected between the positive conductor and the neutral conductor.

2. The method according to claim 1 further comprising the step of:
   connecting a plurality of groups of primary electric cells in parallel such that all negative-neutral and positive-neutral connections to said three-conductor transmission supply system are in parallel.

3. The method according to claim 2 further comprising the step of:
   connecting electrical means between each subgroup and the respective positive or negative conductor to prevent reversal of current flow in said connecting conductor.

4. The method according to claim 3 wherein said electrical means to prevent current reversal are diodes.

5. The method according to and of claims 1 to 4 wherein said cells are primary electrochemical cells.

6. The method according to any of claims 1 to 4 wherein said cells are photovoltaic cells.

7. The method according to claim 3
   wherein each of said groups of cells comprise the photovoltaic cells of a top or bottom half of a laterally divided solar panel and wherein each of said cells in said group is divided into a pair of half cells comprising a left and right half, and wherein said two subgroups comprising each of said groups consist of all the left or all the right half cells;
   wherein said positive, negative and neutral conductors represent conductors connecting a plurality of top or bottom halves of said solar panels in parallel; and
   wherein said half panels are connected to said conductors in a manner such that the left and right halves are alternately the negative and positive connections.

8. The method according to claim 7 wherein said electrical means to prevent current reversal are diodes.

9. A system for supplying DC voltage comprising:
   at least one group of primary electric cells connected to form two series-connected subgroups each containing one-half of the cells;
   three-conductor electric supply system having positive, negative and neutral conductors;
   wherein said subgroups are connected to said three-conductor electric supply systems such that one of said serially connected subgroups is connected between the negative conductor and the neutral conductor and the other of said serially connected subgroups is connected between the positive conductor and the neutral conductor.

10. The system according to claim 9 further comprising a plurality of groups of primary cells having the corresponding positive and negative connected subgroups thereof connected in parallel.

11. The system according to claim 10 further comprising electrical means connected between each subgroup and the respective positive or negative conductor to prevent reversal of current flow in said connecting conductor.

12. The apparatus according to claim 11 wherein said electrical means to prevent current reversal are diodes.

13. The apparatus according to any of claims 9-12 wherein said cells are primary electrochemical cells.

14. The apparatus according to any of claims 9-12 wherein said cells are photovoltaic cells.

15. A power supply system for interconnecting the output of electricity-producing solar panels comprising:
a plurality of solar panels laterally-divided to form a top and bottom halves;
each said top and bottom half further comprising a plurality of pairs of half cells each pair having a right and a left half-cell and wherein all such left half cells and all such right half cells are serially connected forming two subgroups of cells in each half-panel;
three-conductor power transmission means having a positive, a negative and a neutral conductor for conveying current produced by said plurality of groups of cells and connected to said cells in a manner such that one of said subgroups in each group of cells is connected between the positive conductor and the neutral conductor and the other of each of said subgroups in each group is connected between the negative conductor and the neutral conductor; and
wherein all said top subgroups and all said bottom subgroup halves of said solar panels are connected in parallel to said three-conductor power transmission means such that the left and right half subgroups are alternatively the negative and positive connections in both said top and said bottom halves.

16. The apparatus according to claim 15 further comprising electrical means connected between each subgroup and the respective positive or negative conductor to prevent reversal of the current flow in said connecting conductor.

17. The apparatus according to claim 16 wherein said electrical means to prevent current reversal are diodes.

* * * * *